(12) United States Patent
Rappe et al.

(10) Patent No.: US 10,096,729 B2
(45) Date of Patent: Oct. 9, 2018

(54) HIGH-PERFORMING BULK PHOTOVOLTAICS

(71) Applicant: The Trustees of The University of Pennsylvania, Philadelphia, PA (US)

(72) Inventors: Andrew M. Rappe, Penn Valley, PA (US); Steve M. Young, Alexandria, VA (US); Fan Zheng, Philadelphia, PA (US)

(73) Assignee: The Trustees of The University of Pennsylvania, Philadelphia, PA (US)

( * ) Notice: Subject to any disclaimer, the term of this patent is extended or adjusted under 35 U.S.C. 154(b) by 0 days.

(21) Appl. No.: 15/112,708

(22) PCT Filed: Jan. 23, 2015

(86) PCT No.: PCT/US2015/012569
§ 371 (c)(1),
(2) Date: Jul. 20, 2016

(87) PCT Pub. No.: WO2015/160410
PCT Pub. Date: Oct. 22, 2015

(65) Prior Publication Data
US 2016/0336466 A1      Nov. 17, 2016

Related U.S. Application Data

(60) Provisional application No. 61/931,190, filed on Jan. 24, 2014.

(51) Int. Cl.
*C01D 15/02*       (2006.01)
*C01F 5/00*        (2006.01)
*C01G 21/02*       (2006.01)
*H01L 31/02*       (2006.01)
*H01L 31/032*      (2006.01)
*H01L 31/068*      (2012.01)

(52) U.S. Cl.
CPC ........... *H01L 31/032* (2013.01); *C01D 15/02* (2013.01); *C01F 5/00* (2013.01); *C01G 21/02* (2013.01); *C01P 2006/40* (2013.01); *H01L 31/068* (2013.01)

(58) Field of Classification Search
CPC ........... C01D 15/02; C01F 5/00; C01G 21/02; H01L 31/032; C01P 2006/40
See application file for complete search history.

(56) References Cited

U.S. PATENT DOCUMENTS 4,569,728 A    2/1986   Davari et al.
6,545,791 B1   4/2003   McCaughan et al.
7,807,917 B2   10/2010  Atanackovic
(Continued)

OTHER PUBLICATIONS

Liu et al. "Hydrothermal synthesis and photocatalytic properties of ATaO3 and ANbO3 (a=Na and K)" / International Journal of Hydrogen Energy 32 (2007) 2269-2272.*
(Continued)

*Primary Examiner* — Amber R Orlando
*Assistant Examiner* — Syed T Iqbal
(74) *Attorney, Agent, or Firm* — Baker & Hostetler LLP

(57) ABSTRACT

The present invention provides materials with high bulk photovoltaic effect response. The present invention also provides for products comprising the high bulk photovoltaic effect materials of the present invention.

32 Claims, 11 Drawing Sheets

(56) References Cited

U.S. PATENT DOCUMENTS

| | | | |
|---|---|---|---|
| 8,267,883 B2* | 9/2012 | DiMauro | A61F 2/30767 422/122 |
| 9,484,475 B2 | 11/2016 | Rappe et al. | |
| 2003/0196692 A1* | 10/2003 | Koyanagi | H01G 9/2031 136/263 |
| 2007/0138459 A1 | 6/2007 | Wong et al. | |
| 2007/0248515 A1 | 10/2007 | Tompa et al. | |
| 2012/0280224 A1 | 11/2012 | Doolittle et al. | |

OTHER PUBLICATIONS

Bhatt et al., "The effect of Cr doping on optical and photoluminescence properties of $LiNbO_3$ crystals", Solid State Communications, Aug. 2003, vol. 127, 457-462.

Giannozzi et al., "Quantum ESPRESSO: a modular and open-source software project for quantum simulations of materials", Journal of Physics: Condensed Matter, Sep. 1, 2009, 21, 395502, 19 pages.

Hao et al., "Exceptionally large room-temperature ferroelectric polarization in the $PbNiO_3$ multiferroic nickelate: First-principles study", Physical Review B, Jul. 2012, 86, 014116-1-014116-5.

Rappe et al., "First Principles Calculation of the Shift Current Photovoltaic Effect in Ferroelectrics", Physical Review Letters, Sep. 14, 2012, 109, 116601-1-116601-5.

Young et al., "First-Principles Calculation of the Bulk Photovoltaic Effect in Bismuth Ferrite", Physical Review Letters, Dec. 7, 2012, 109, 236601-1-236601-5.

* cited by examiner

HIGH-PERFORMING BULK PHOTOVOLTAICS

CROSS REFERENCE TO RELATED APPLICATIONS

This application is a national phase application of PCT Patent Application No. PCT/US2015/012569 and claims benefit of U.S. Patent Application No. 61/931,190, filed Jan. 24, 2014, the disclosures of each are incorporated herein in its entirety their entireties.

GOVERNMENT RIGHTS

The invention was made with government support under Grant No. DE-FG02-07ER46431 awarded by the Department of Energy Office of Basic Energy Sciences; under Grant No. FA9550-10-1-0248 awarded by the Air Force Office of Scientific Research, Air Force Materiel Command, USAF; and under Grant No. N00014-12-1-10033 awarded by the Office of Navel Research. The government has certain rights in the invention.

TECHNICAL FIELD

The disclosed inventions are in the field of photovoltaic devices. The disclosed inventions are also in the field of polar oxide materials. The disclosed inventions are also in the field of bulk photovoltaic materials.

BACKGROUND

Solar energy is the most promising source of renewable, clean energy to replace the current reliance on fossil fuels. To make solar energy viable, inexpensive materials that efficiently convert solar radiation into electricity must be developed. The bulk photovoltaic effect (BPVE) has long been observed in bulk polar materials, especially ferroelectrics. Despite intense initial interest in these materials, early explorations revealed low energy conversion efficiency, in part due to the high band gaps of most known ferroelectrics.

Thus, there is a need for novel materials exhibiting the bulk photovoltaic effect with low band gaps. The invention is directed to these and other important needs.

SUMMARY

The present invention provides compositions comprising a polar oxide characterized as having a $LiNbO_3$ structure with a band gap of less than about 2.0 eV.

The present invention also provides photovoltaic devices and sensors comprising one or more compositions described herein.

The general description and the following detailed description are exemplary and explanatory only and are not restrictive of the invention, as defined in the appended claims. Other aspects of the present invention will be apparent to those skilled in the art in view of the detailed description of the invention as provided herein.

BRIEF DESCRIPTION OF THE DRAWINGS

The summary, as well as the following detailed description, is further understood when read in conjunction with the appended drawings. For the purpose of illustrating the invention, there are shown in the drawings exemplary embodiments of the invention; however, the invention is not limited to the specific methods, compositions, and devices disclosed. In addition, the drawings are not necessarily drawn to scale. In the drawings.

DETAILED DESCRIPTION OF ILLUSTRATIVE EMBODIMENTS

Figure 1:
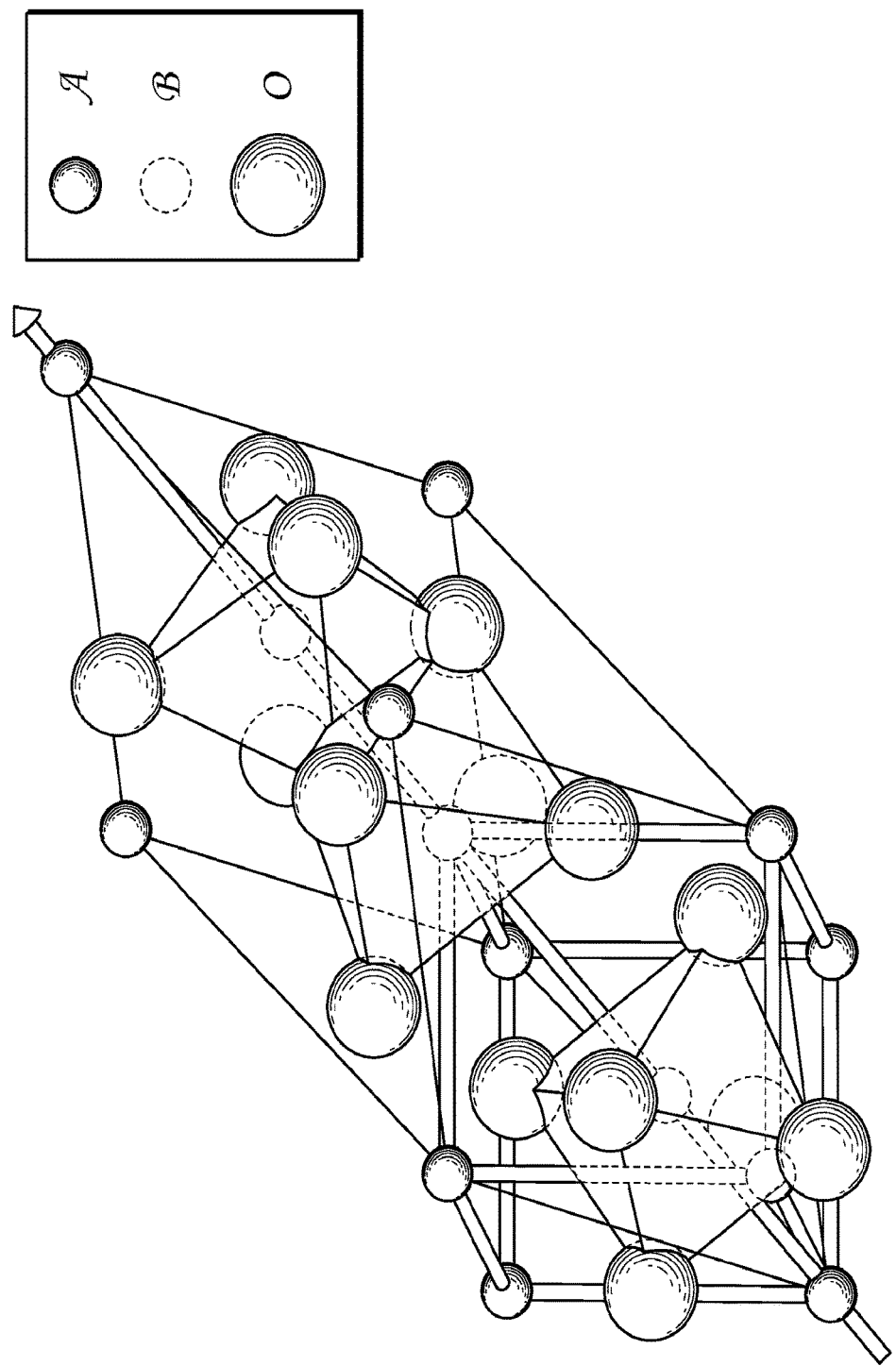
FIG. 1 illustrates the $LiNbO_3$ (LNO) primitive cell, overlayed with the pseudo-cubic perovskite cell. The direction of the polar distortion is indicated by the black arrow.
Figure 2A:
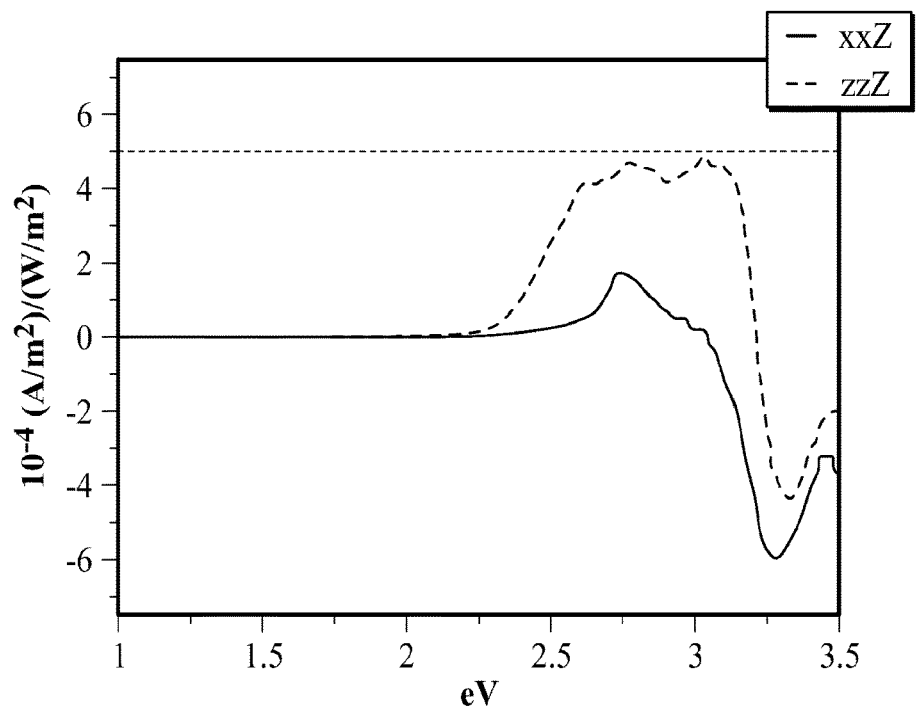
FIG. 2 illustrates the current density responses and Glass coefficients for LNO (GGA) and BFO (GGA+U). The current density responses are shown in (a) and (c), for LNO and BFO, respectively. The Glass coefficients appear in (b) and (d), for LNO and BFO, respectively. In all cases, only the response in the direction of material polarization is shown, for both perpendicular (xxZ) and parallel (zzZ) light polarization. Dashed lines appear at benchmark values of current density and Glass coefficient chosen to represent the maximum response of these materials.
Figure 2B:
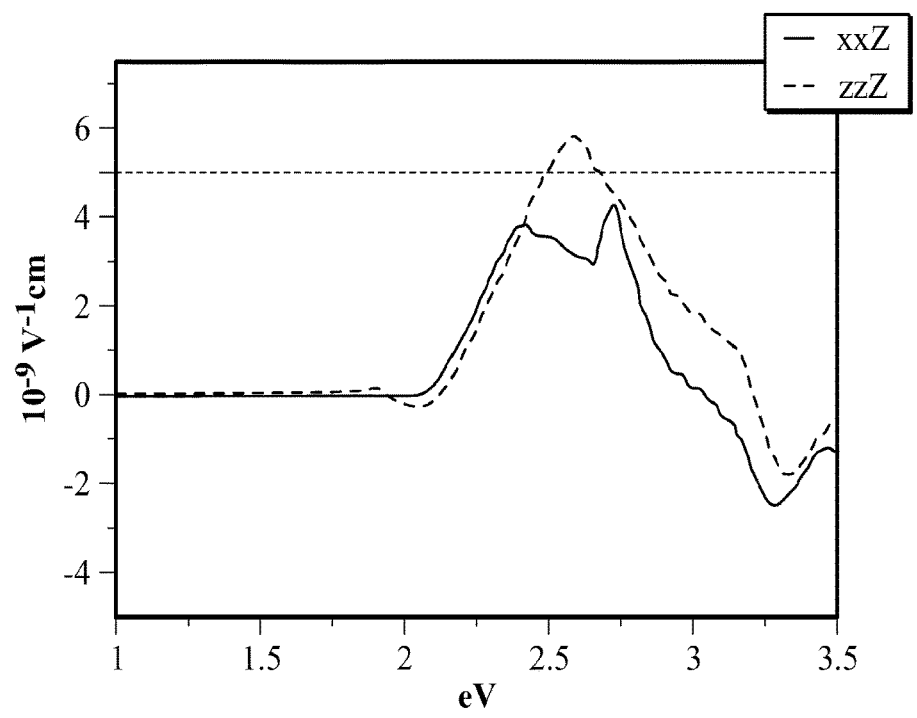
Figure 2C:
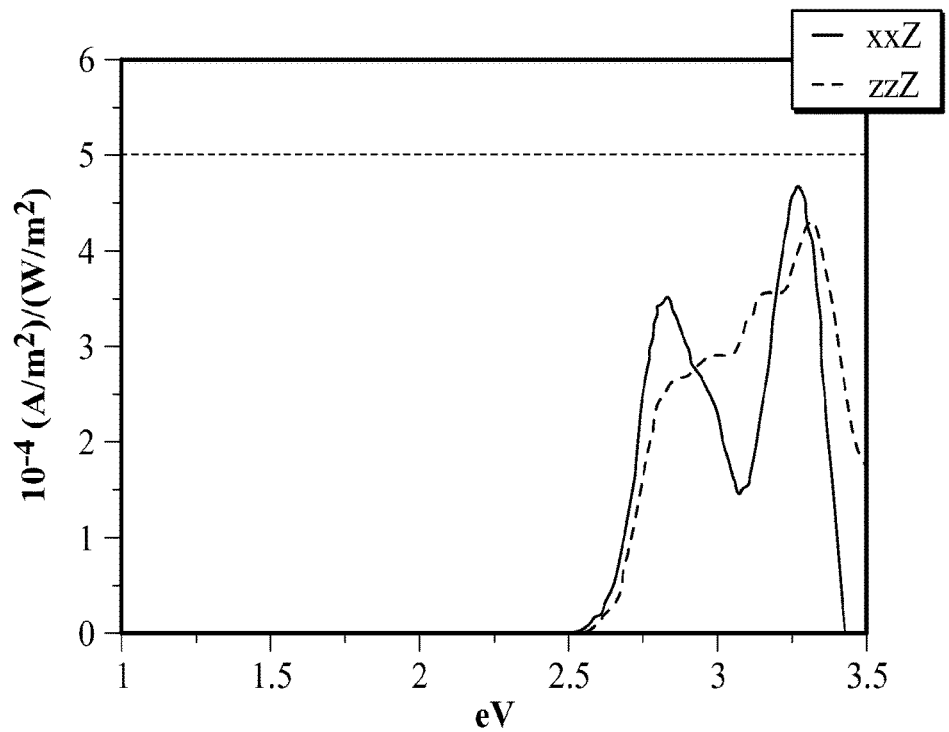
Figure 2D:
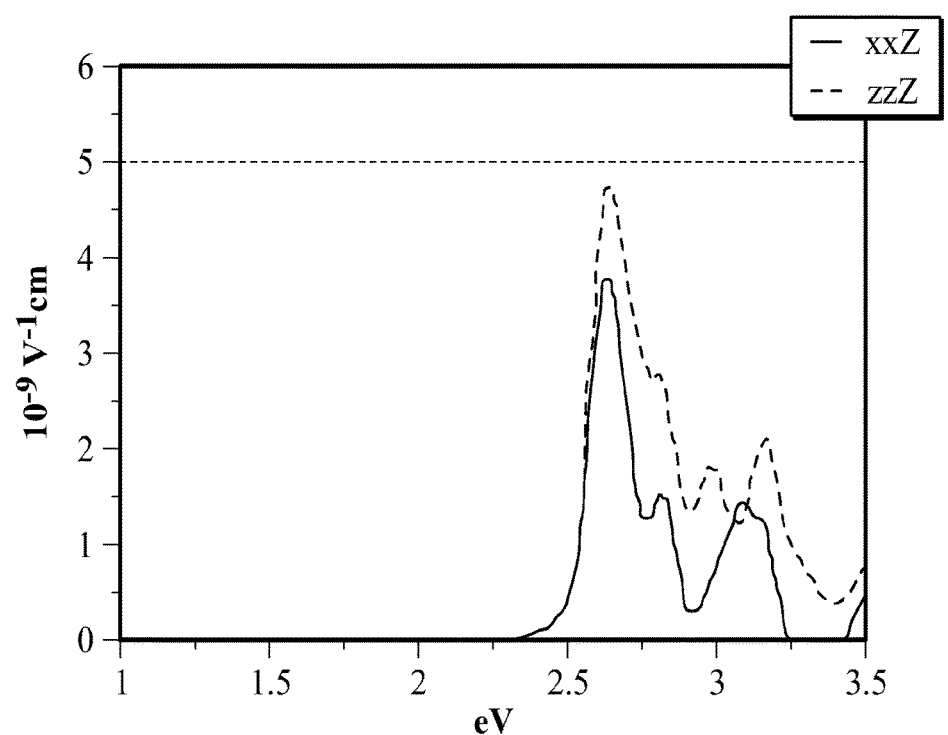

The present invention may be understood more readily by reference to the following detailed description taken in connection with the accompanying figures and examples, which form a part of this disclosure. It is to be understood that this invention is not limited to the specific devices, methods, applications, conditions or parameters described and/or shown herein, and that the terminology used herein is for the purpose of describing particular embodiments by way of example only and is not intended to be limiting of the claimed invention. Also, as used in the specification including the appended claims, the singular forms "a," "an," and "the" include the plural, and reference to a particular numerical value includes at least that particular value, unless the context clearly dictates otherwise. The term "plurality", as used herein, means more than one. When a range of values is expressed, another embodiment includes from the one particular value and/or to the other particular value. Similarly, when values are expressed as approximations, by use of the antecedent "about," it will be understood that the particular value forms another embodiment. All ranges are inclusive and combinable.

It is to be appreciated that certain features of the invention which are, for clarity, described herein in the context of separate embodiments, may also be provided in combination in a single embodiment. Conversely, various features of the invention that are, for brevity, described in the context of a single embodiment, may also be provided separately or in any subcombination. Further, reference to values stated in ranges include each and every value within that range.

The present invention provides compositions comprising polar oxides characterized as having a $LiNbO_3$ structure with a band gap of less than about 2.0 eV. Particularly suitable polar oxides can also have band gaps of less about 1.8 eV, or even in the range of from about 1.2 eV to about 1.8 eV, or in the range of from about 1.7 eV to about 1.8 eV. Suitable compositions can comprise polar oxides comprising one or more $d^{10}s^0$ cations. The one or more $d^{10}s^0$ cations can comprise cations of electronegative metals. In other embodiments of the present invention, the one or more $d^{10}s^0$ cations comprise one or more of the following: $Pb^{4+}$, $Bi^{5+}$, $Tl^{3+}$, $Hg^{2+}$, $Au^{1+}$, $Pt^0$, $Sb^{5+}$, $Sn^{4+}$, $In^{3+}$, $Cd^{2+}$, $Ag^{1+}$, $Pd^0$, $As^{5+}$, $Ge^{4+}$, $Ga^{3+}$, $Zn^{2+}$, $Cu^{1+}$, $Ni^0$. In further embodiments, the one or more $d^{10}s^0$ cations comprise $Bi^{5+}$. Suitable polar oxides can also comprise $Mg_{1/2}Zn_{1/2}PbO_3$, or more generally can comprise $Mg_{1-x}Zn_xPbO_3$, wherein x is in the range of from 0.01 to about 0.99. In other embodiments of the present invention the polar oxides can comprise $LiBiO_3$. In yet other embodiments, the polar oxide is $PbNiO_3$.

The present invention also provides compositions wherein the composition is characterized as having a polarization of at least about 50 $\mu C/cm^2$. Particularly suitable compositions can also have polarizations in the range of about 75 $\mu C/cm^2$ to about 100 $\mu C/cm^2$.

The present invention also provides compositions wherein the composition is characterized as having a Glass coefficient of greater than about $30 \times 10^{-9}$ cm/V. Particularly suitable compositions can have Glass coefficients greater than about $80 \times 10^{-9}$ cm/V, or even greater than about $115 \times 10^{-9}$ cm/V.

The present invention also provides compositions wherein the composition is characterized as having a current density responses of greater than about $13 \times 10^{-4}$ $(A/m^2)/(W/m^2)$. Particularly suitable compositions can have current density responses greater than about $20 \times 10^{-4}$ $(A/m^2)/(W/m^2)$, or even greater than about $45 \times 10^{-4}$ $(A/m^2)/(W/m^2)$.

In other embodiments, the present invention also provides photovoltaic devices comprising one or more compositions described herein.

In other embodiments, the present invention also provides sensors comprising one or more compositions described herein. In some embodiments, compositions with band gaps that do not correspond to the visible light range may be used in sensing or detecting devices that detect electromagnetic radiation outside of the visible range, such as microwave, infrared, ultraviolet, or x-ray.

BPVE can be attributed to "shift currents", and the bulk photocurrents may be calculated from first-principles. The ab initio calculation of the shift current and subsequent analysis yield several chemical and structural criterion for optimizing the response.

There are two figures of merit for evaluating the BPVE in a material: the current density response to a spatially uniform electric field, and the Glass coefficient. The current density response is given by the tensor $$J_q(\omega) = \sigma_{req}(\omega) E_r^\theta(\omega) E_\pi^\theta(\omega)$$

$$\sigma_{req}(\omega) = e \sum_{n',n''} \int dk I_{rs}(n',n'',k;\omega) R_q(n',n'',k)$$

where $E^\theta$ is the vector of the illumination field, and n' and n'' index bands. Letting f denote filling, $\chi$ the Berry connection, and $\phi$ the phase of the transition dipole, the expression $$I_{rs}(n', n'', k; \omega) = \pi \left(\frac{e}{m\hbar\omega}\right)^2 (f[n''k] - f[n'k]) \times \quad (1)$$
$$\langle n'k|\hat{P}_r|n''k\rangle\langle n''k|\hat{P}_s|n'k\rangle \times \delta(\omega_{n''}(k) - \omega_{n'}(k) \pm \omega)$$

describes the intensity of transitions, and $$R_q(n', n'', k) = -\frac{\partial \phi_{n'n''}(k,k)}{\partial k_q} - [\chi_{n''q}(k) - \chi_{n'q}(k)] \quad (2)$$

is the expression for the "shift vector", which describes a distance associated with the excited carrier. Roughly speaking, the two terms can be thought of as giving the number of carriers excited and the velocity of those carriers. Without being limited to any particular theory, it is believed that this mechanism is profoundly different from other photovoltaic effects; rather than relying on excitation of carriers which are then separated by an electric field, the carriers are electron/hole pairs in coherent excited states that possess intrinsic momentum of opposite sign. This allows for arbitrarily high photovoltages; the Schockly-Quessier limit does not apply, a major advantage of BPVE. In particular, the open-circuit voltage is determined by the competition between the photocurrent and countervailing voltage-driven leakage that depends on the overall resistance of the sample. This sample dependence prevents straightforward calculation.

Determining the total current in a sample is complicated by the attenuation of incident illumination as it travels through the material. In the limit of a thick sample that will completely absorb the illumination, the total current can be obtained from the Glass coefficient G $$J_q(\omega) = \frac{\sigma_{rrq}(\omega)}{\alpha_{rr(\omega)}}|E_r^\theta(\omega)|^2 W = G_{rrq}(\omega) I_r(\omega) W \quad (3)$$

where $\alpha$ is the absorption coefficient, and W is the sample width. Thus, the current density tensor and Glass coefficient describe the response in the regimes of infinite thinness and infinite thickness, respectively. In practice, "infinite thickness" is on the order of microns, and total photocurrent is usually best described by the Glass coefficient.

However, the Glass coefficient provides additional information about the response. In the limit where $\epsilon^i \ll \epsilon^r$, $$\alpha \approx \frac{\omega}{cn}\epsilon^i = \left(\frac{\theta}{m}\right)^2 \frac{\pi}{\epsilon_0 cn\hbar\omega} \sum_{n',n''} \int dk I_{rs}(n', n'', k; \omega)$$

and the Glass coefficient becomes $$G_{rrq}(\omega) = \frac{1}{2\epsilon_0 cn}\frac{\sigma_{rrq}(\omega)}{\alpha_{rr(\omega)}} = \frac{e}{2\hbar\omega}\frac{\sum_{n',n''}\int dk I_{rr}(n',n'',k;\omega) R_q(n',n'',k)}{\sum_{n',n''}\int dk I_{rr}(n',n'',k;\omega)}$$

The Glass coefficient is therefore closely related to the weighted average shift vector, and allows us to estimate the contribution of both terms in the shift current expression.

Shift vector magnitude depends on the chemical and structural properties of materials. Large shift vectors are characterized by valence and/or conduction states that are both strongly asymmetric and delocalized in the current direction. In this regard, many distorted perovskite ($ABO_3$) ferroelectrics are crippled by the presence of $d^0$ cations enclosed in octahedral oxygen cages. The conduction band edge is dominated by $t_{2g}$-like d states that are largely nonbonding. Coupled with the tendency for d states to localize, the result is that both shift vectors and transition response are very weak near the band gap. The delocalized $e_g$ states are much higher in energy, effectively raising the energy threshold for significant BPVE.

TABLE 1

|   | $PbNiO_3$ | $Mg_{1/2}Zn_{1/2}PbO_3$ | $LiBiO_3$ |
|---|---|---|---|
| a | 5.63 Å | 5.77 Å | 5.67 Å |
| α | 57° | 57° | 56° |
| A (2a) | (0.0, 0.0, 0.0) | (0.0, 0.0, 0.0) | (0.0, 0.0, 0.0) |
| B (2a) | (0.214, 0.214, 0.214) | (0.216, 0.216, 0.216) | (0.213 0.213, 0.213) |
| O (6b) | (0.830, 0.098, 0.415) | (0.794, 0.128, 0.390) | (0.798, 0.122, 0.405) |
| P | 99 μC/cm$^2$ | 83 μC/cm$^2$ | 50 μC/cm$^2$ |

Table 1 shows the structural data for three embodiments of the present invention. $PbNiO_3$ and $LiBiO_3$ are in space group R3c, while $Mg_{1/2}Zn_{1/2}PbO_3$ is in R3. However, the deviations of the coordinates from the R3c positions are miniscule (<0.2%), so they are presented as such with Mg and Zn each occupying one site of the A position.

To overcome the weak BPVE response of $d^0$ oxides, we investigated systems that involve both large distortions to oxygen cages, (increasing the bonding character of any $d^0$ states) as well as $d^{10}$ cations with less localized s and/or p states near the band edge. $d^{10}$ cations can dramatically improve the activity of photocatalysts. We found the most promising candidates to be polar oxides taking the $LiNbO_3$ structure, with $d^{10}s^0$ cations $Pb^{4+}$ and $Bi^{5+}$. This structure can also be obtained by distorting the perovskite structure rhombohedrally, and allowing polar distortions along and oxygen-cage rotations about ⟨111⟩. Notable ferroelectrics with this structure (but $d^0$ cations) include $LiNbO_3$ (LNO) and $BiFeO_3$ (BFO). LNO is known for its large nonlinear optical response, and was one of the first materials in which the bulk photovoltaic effect was observed and studied; however, its band gap is well outside the visible spectrum. BFO has garnered much attention recently for its multiferroic behavior and low band gap of about 2.74 eV, which has led to explorations of its photovoltaic response. We have used these as benchmarks for the present study. In all of these cases, as with the archetypal ferroelectrics $BaTiO_3$ and $PbTiO_3$, the lowest unoccupied molecular orbitals are dominated by cation d-states, and have very similar response magnitudes.

We consider only current response in the direction of material polarization for both perpendicular (xxZ) and parallel (zzZ) light polarization, as these are the only tensor elements that can contribute to response to unpolarized light. For ease of comparison, we mark baseline values reflecting the maximum response of our benchmark materials, shown in FIG. 2, with a dashed, red line. These are, for the current density and Glass coefficient, respectively, $5\times10^{-4}$ (A/m$^2$)/(W/m$^2$) and $5\times10^{-9}$ cm/V. These baseline values are reproduced for comparison in FIGS. 4, 5, and 6 (in the plots of current density and Glass coefficient, depicted in portions (c) and (d) of each figure).

Figure 3A:
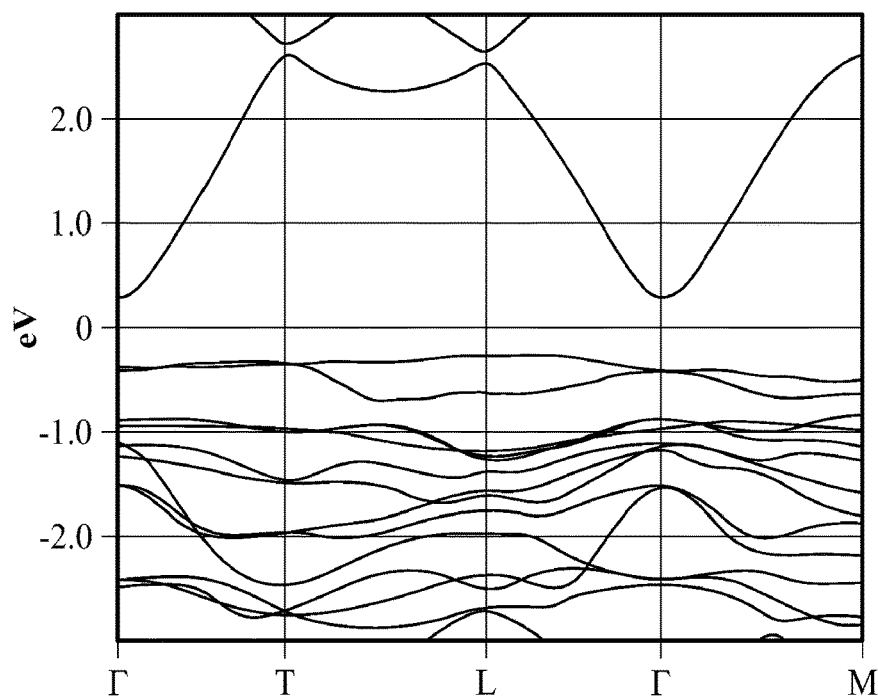
FIG. 3 illustrates the band structures of several embodiments of the present invention.
Figure 3B:
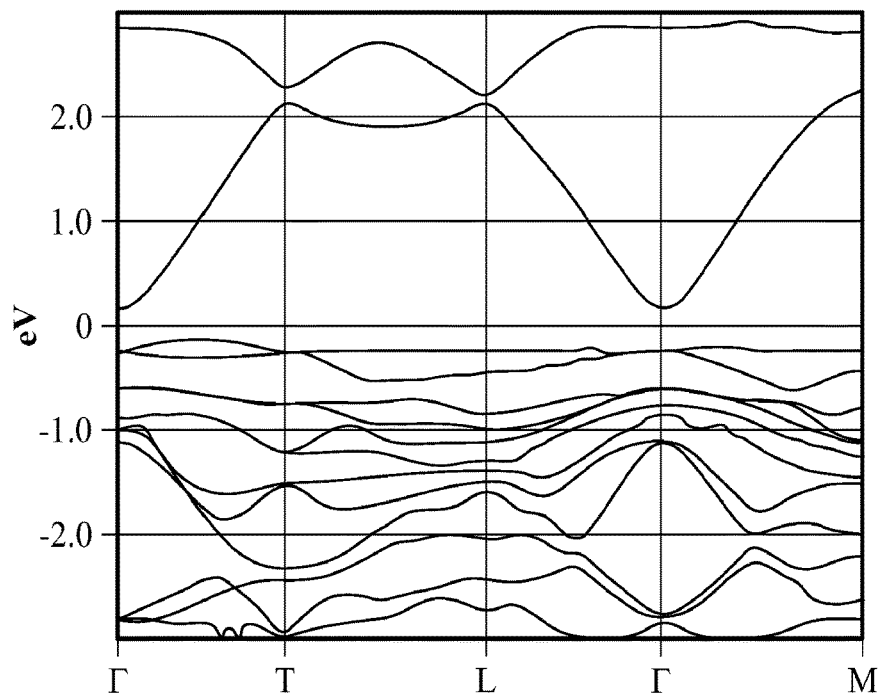
Figure 3C:
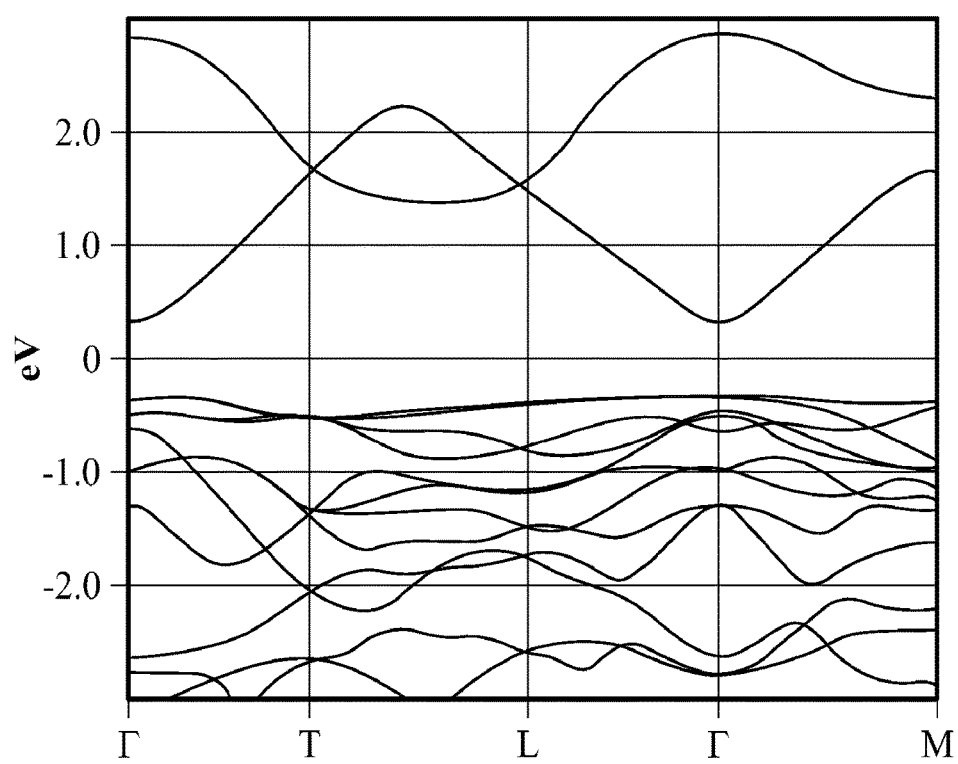
Figure 4A:
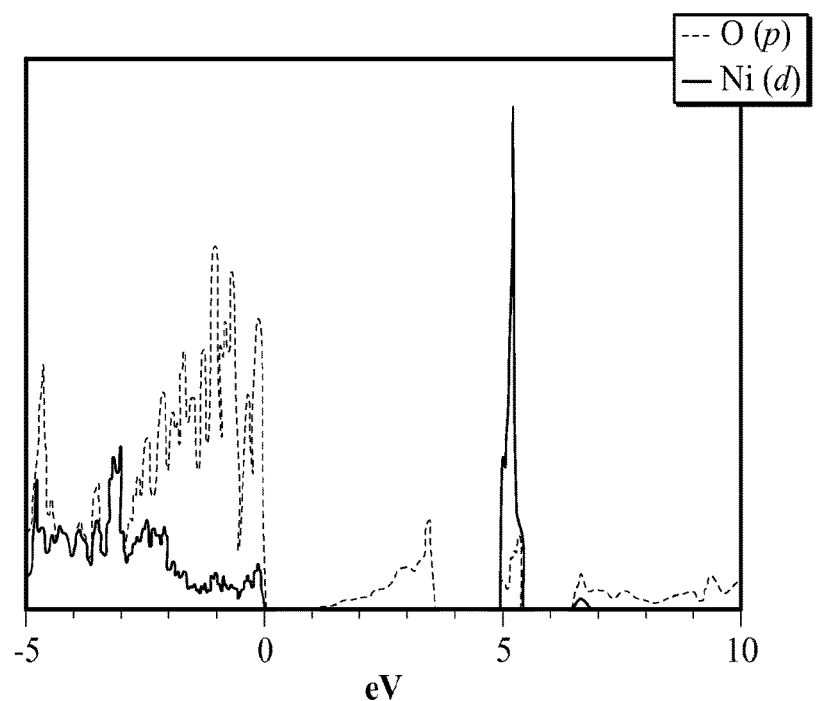
FIG. 4 illustrates the projected density of states for one embodiment of the present invention in (a) and (b). Portion (c) illustrates the current density response for one embodiment of the present invention. Portion (d) illustrates the Glass coefficient for one embodiment of the present invention.
Figure 4B:
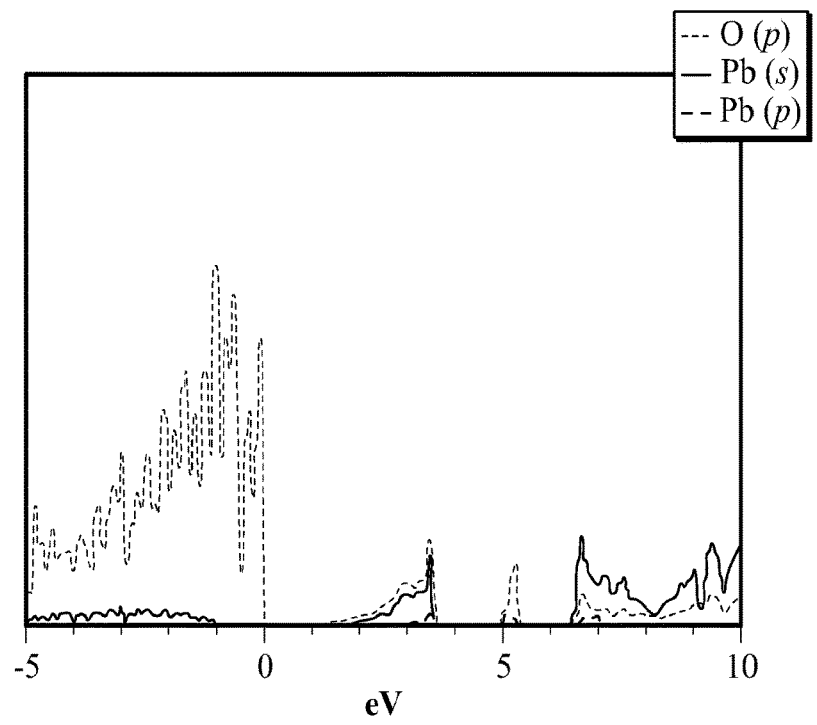
Figure 4C:
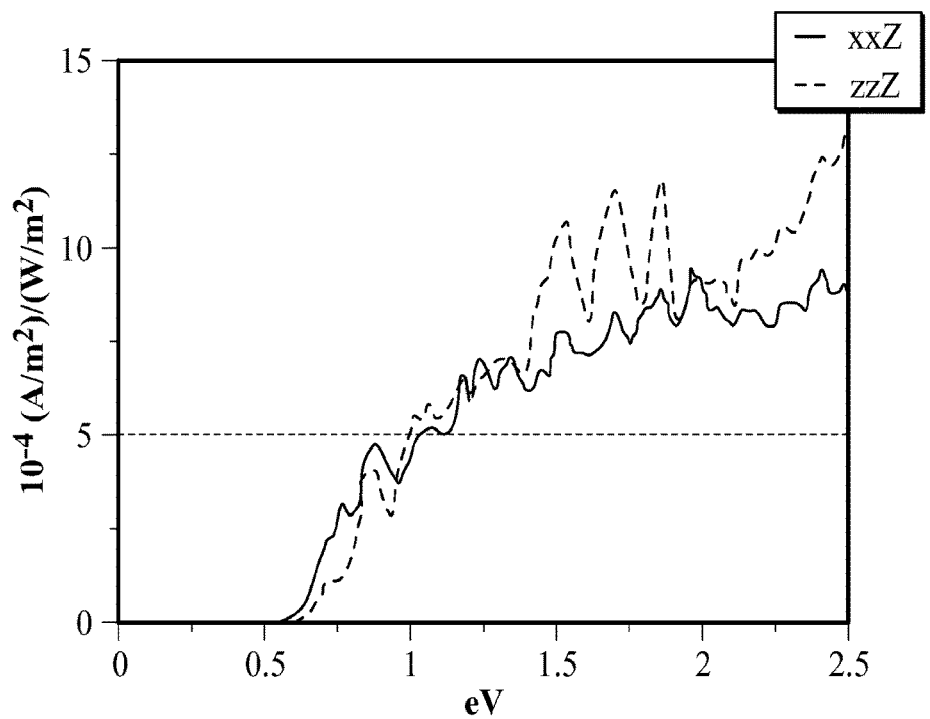
Figure 4D:
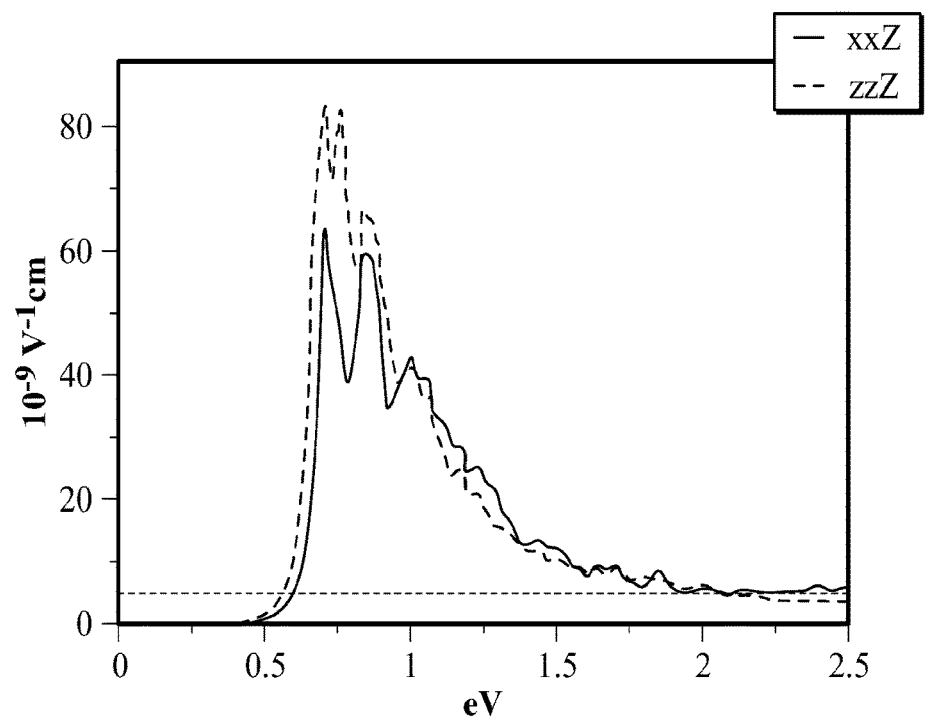

We have studied three materials taking the LNO structure (FIG. 1): $PbNiO_3$, $Mg_{1/2}Zn_{1/2}PbO_3$, and $LiBiO_3$. The first has been synthesized, and the latter two are similar in composition to known materials. The structure parameters and minimum polarizations are given in Table 1. All three satisfy our requirements of low band gap, $d^{10}$ cations, and large polar distortions. Furthermore, as seen in FIG. 3, all three have qualitatively similar band structures, featuring highly dispersive conduction bands, in contrast to the usual case of $d^0$ perovskite derivatives. FIG. 3 depicts the band structures of (a) $PbNiO_3$, (b) $Mg_{1/2}Zn_{1/2}bO_3$, and (c) $LiBiO_3$. As we will show, this arises due to unfilled s-like—rather than d-like—states composing the conduction band, and has profound consequences for the bulk photovoltaic response.

Shift current response was calculated using the methods described by Young and Rappe, *Phys. Rev. Lett.* 109, 116601 (2012), incorporated herein by reference, in its entirety, from wavefunctions generated using density functional theory, with the generalized gradient approximation (GGA) and optimized, norm conserving pseudopotentials. The presented results exclude spin-orbit effects, as these were not found to substantially influence the results. For BFO, a Hubbard U of 5 eV was used for Fe 3d, as described by Young et al., *Phys. Rev. Lett.* 109, 236601 (2012), incorporated herein by reference, in its entirety. For $PbNiO_3$, a Hubbard U of 4.6 eV was used for Ni 3d, as described by Hao et al., *Phys. Rev. B* 86, 014116 (2012), incorporated herein by reference, in its entirety. QUANTUM ESPRESSO, described by Giannozzi et al., *J. Phys.: Condens. Matter* 21, 395502 (2009), incorporated herein by reference, in its entirety, available for download http://www.quantum-espresso.org/, was used for the electronic structure calculations, and OPIUM was used to generate pseudopotentials. HSE calculations were performed on a 8×8×8 k-point grids, with 4×4×4 grids for the exact exchange calculations. The present results are for the experimental structure in the cases of LNO, BFO, and PbNiO3, and computationally relaxed structures for the other materials. Structural relaxations and calculations of the shift current were performed at the level of LDA and found to vary minimally from the GGA results; due to the high expense of exact exchange calculations, similar results could not be obtained for HSE.

TABLE 2

|   | Band gap | Max. Glass coefficient × $10^{-9}$ cm/V | Max. current density × $10^{-4}$(A/m$^2$)/(W/m$^2$) |
|---|---|---|---|
| $LiNbO_3$ | 3.7 eV [23] | 6 | 5 |
| $BiFeO_3$ | 2.74 eV [25] | 5 | 5 |
| $PbNiO_3$ | 1.2 eV(HSE) [30] | 80 | 13 |
| $Mg_{1/2}Zn_{1/2}PbO_3$ | 1.2 eV(HSE) | 115 | 20 |
| $LiBiO_3$ | 1.7 eV(HSE) | 30 | 45 |

Table 2 shows the band gap and response characteristics of three embodiments of the present invention, along with $LiNbO_3$ and $BiFeO_3$ for comparison.

Embodiments of the present invention include several polar oxides in the $LiNbO_3$ structure with strong computed BPVE response and low band gaps, summarized in Table 2. The compositions, featuring $Pb^{4+}$ or $Bi^{5+}$ cations, were chosen for the absence of d-states at the band edge, and instead have conduction bands formed by low-lying s-states hybridized with oxygen p-states. In addition to creating significantly lower band gaps, this makes for large, diffuse orbitals and results in strongly delocalized states; combined with large polar distortions, they effect significant shift current response that is over an order of magnitude higher than that previously known. Given the minimal contributions from the other cations, the possibility of tuning the response via composition without altering its fundamental character is strongly suggested. Moreover, in combination with recent demonstrations that careful device construction can dramatically improve BPVE performance, these results indicate that BPVE can be much stronger than previously thought, bolstering hopes that the phenomenon can be successfully exploited. Other embodiments of the present invention include photovoltaic devices and solar cells—such as those described in U.S. patent application Ser. No. 13/649,154, which is incorporated herein by reference, in its entirety—utilizing one or more of the polar oxides described herein.

Example 1

$PbNiO_3$ has recently been synthesized and explored theoretically by others. Like BFO, it is antiferromagnetic with weak spin-canting, and possesses an even larger polarization, calculated at 100 $\mu C/cm^2$. Its band gap is even lower than BFO, with Heyd-Scuseria-Ernzerhof (HSE) screened hybrid functional predicting 1.2 eV. In BFO, bismuth has oxidation state 3+, so that its 6s orbital is filled, and the exchange splitting of iron determines the gap. However, in $PbNiO_3$, lead is 4+, and its 6s-states appear lower in energy than the nickel exchange splitting, resulting in a distinct electronic profile. This can be clearly seen in the projected density of states (FIGS. 4(a) and (b)): the lowest conduction band is almost entirely Pb 6s and O 2p states, while the d-states only appear in the valence band and higher in the conduction manifold. The unfilled half of $e_g$ of the high-spin $d^8$ nickel appears as a sharp peak above the unfilled lead s-orbitals, which have strongly hybridized with oxygen p-orbitals, resulting in a low band gap (1.2 eV in HSE). While this serves to lower the band gap dramatically, a further result of this is a Glass coefficient (FIG. 4(d)) over an order of magnitude larger than the benchmark value. The current density is modest by comparison, though it still exceeds the benchmark, indicating large shift vectors with relatively low absorption. This material has a large (c) current density response ($\approx$2×benchmark), and a very large (d) Glass coefficient ($\approx$16×benchmark).

Example 2

Figure 5A:
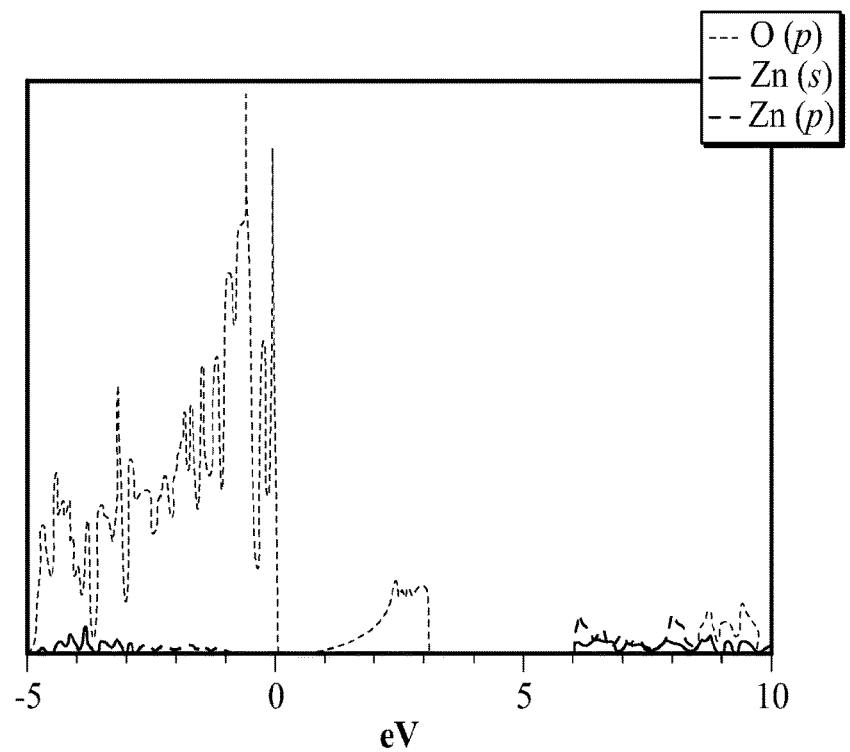
FIG. 5 illustrates orbital-projected densities of states for one embodiment of the present invention in (a) and (b). Portion (c) illustrates the current density response for one embodiment of the present invention. Portion (d) illustrates the Glass coefficient for one embodiment of the present invention.
Figure 5B:
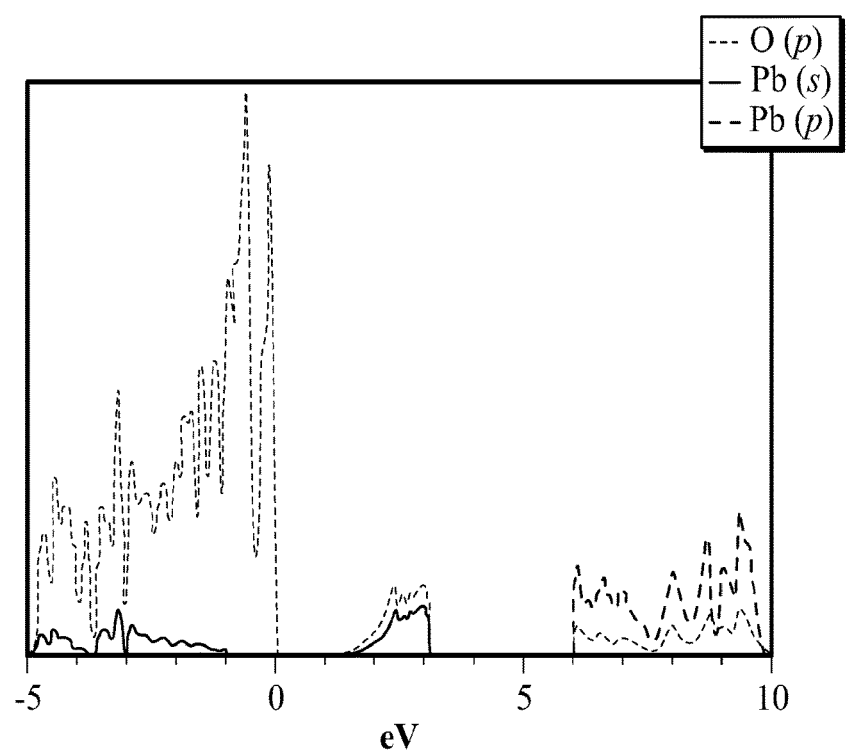
Figure 5C:
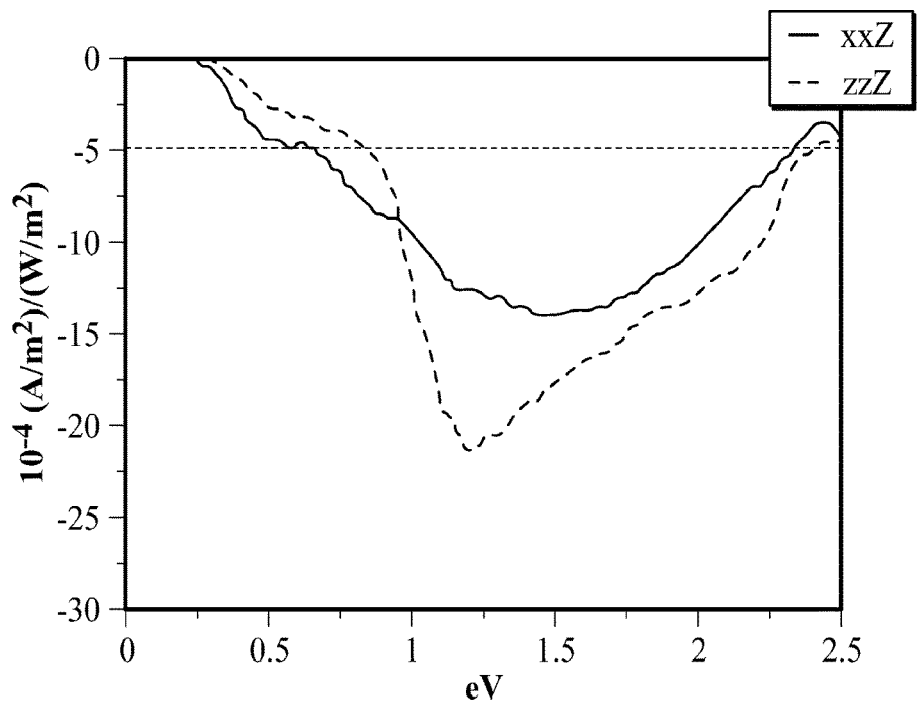
Figure 5D:
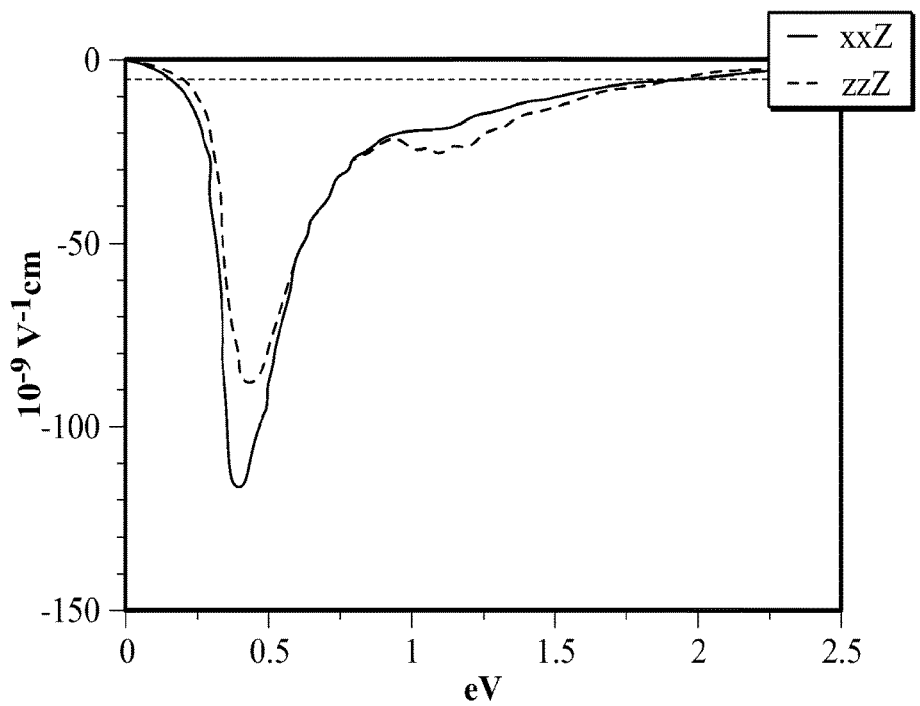

$HgPbO_3$ and $ZnSnO_3$ are known to take the ilmenite and $LiNbO_3$ structures, respectively. However, the first is metallic and the second has a high band gap and only modest photovoltaic response. We first calculated the response of $ZnPbO_3$, but found it to be borderline metallic, despite promising response; to raise the gap we substituted Mg for half of the Zn. FIG. 5 depicts the orbital-projected densities of states for $Mg_{1/2}Zn_{1/2}PbO_3$ in (a) and (b). The valence band is formed almost entirely from oxygen p-orbitals, and the conduction band is hybridized Pb 6s and O 2p-states. This results in a low band gap (1.2 in HSE), (c) high current density response ($\approx$4×benchmark), and (d) a very large Glass coefficient ($\approx$25×benchmark). Significantly, the response is anti-parallel to material polarization. Once again, as seen in FIG. 5(b), hybridized Pb 6s states compose the lowest unfilled band. The magnitude of the response is quite high, but the current is antiparallel to the polarization. This is unlike most materials, including our benchmark materials and the aforementioned $PbNiO_3$.

Example 3

$LiBiO_3$ is known to exist in a structure with edge-sharing oxygen octahedra. However, our calculations place the $LiNbO_3$-type structure nearby in energy, at only about 0.01 eV per atom higher; additionally, $NaBiO_3$ is known to take the closely-related ilmenite structure structure. In light of this we consider it highly possible that the $LiBiO_3$ can be synthesized in the $LiNbO_3$ structure.

Figure 6A:
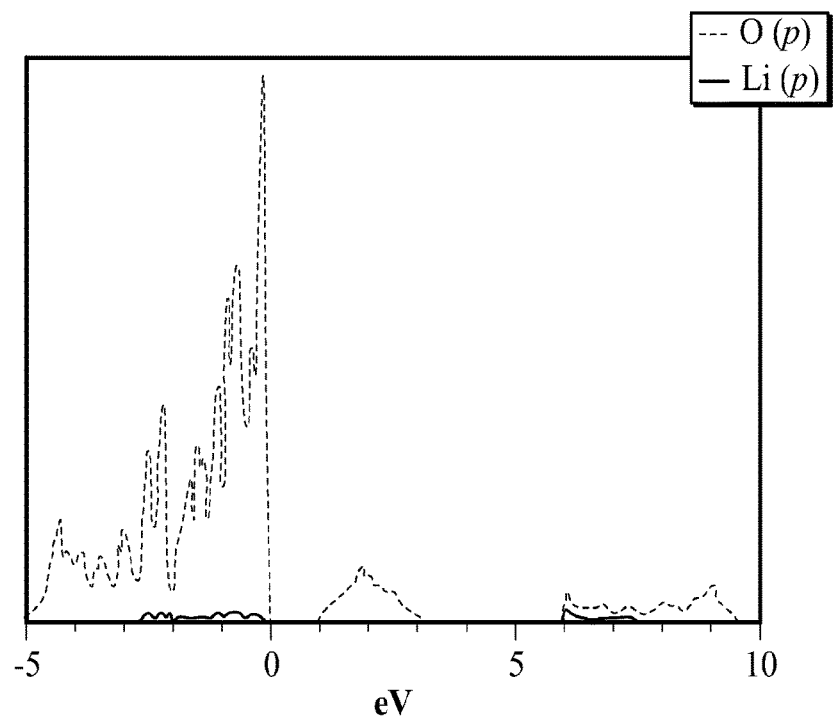
FIG. 6 illustrates orbital-projected densities of states for one embodiment of the present invention in (a) and (b). Portion (c) illustrates the current density response for one embodiment of the present invention. Portion (d) illustrates the Glass coefficient for one embodiment of the present invention.
Figure 6B:
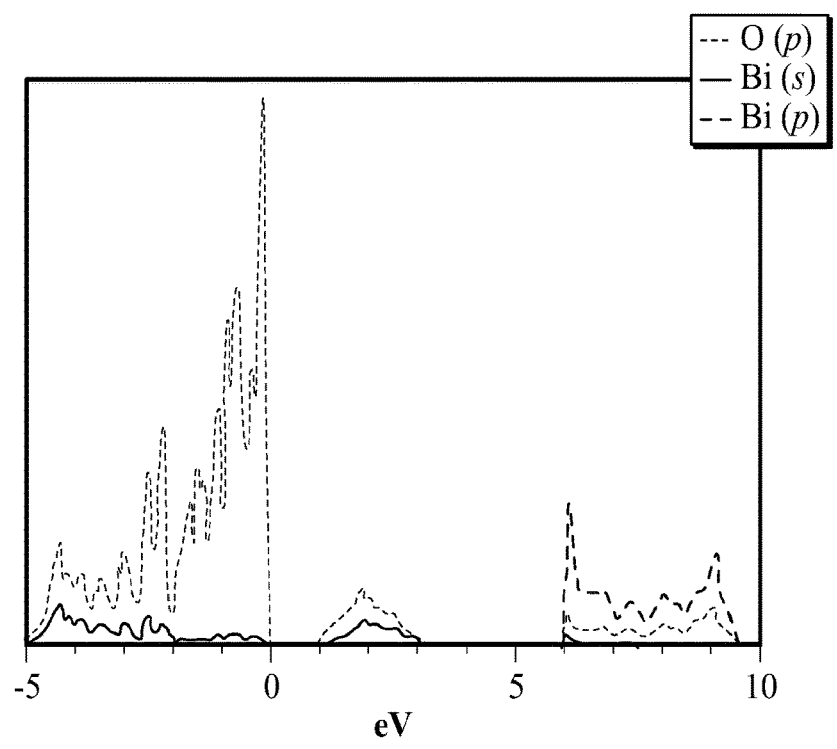
Figure 6C:
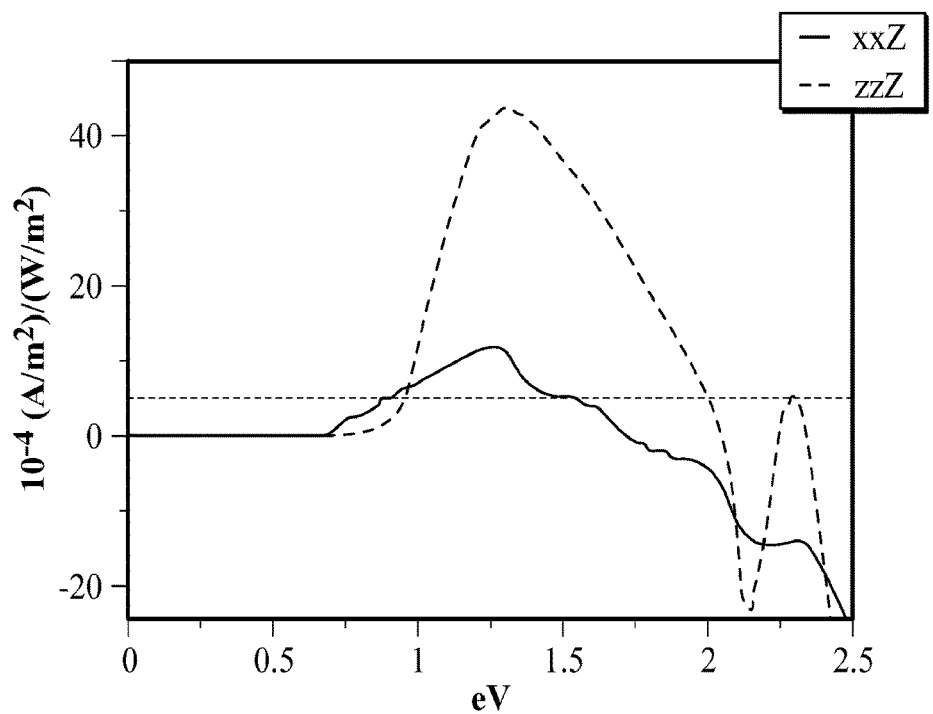
Figure 6D:
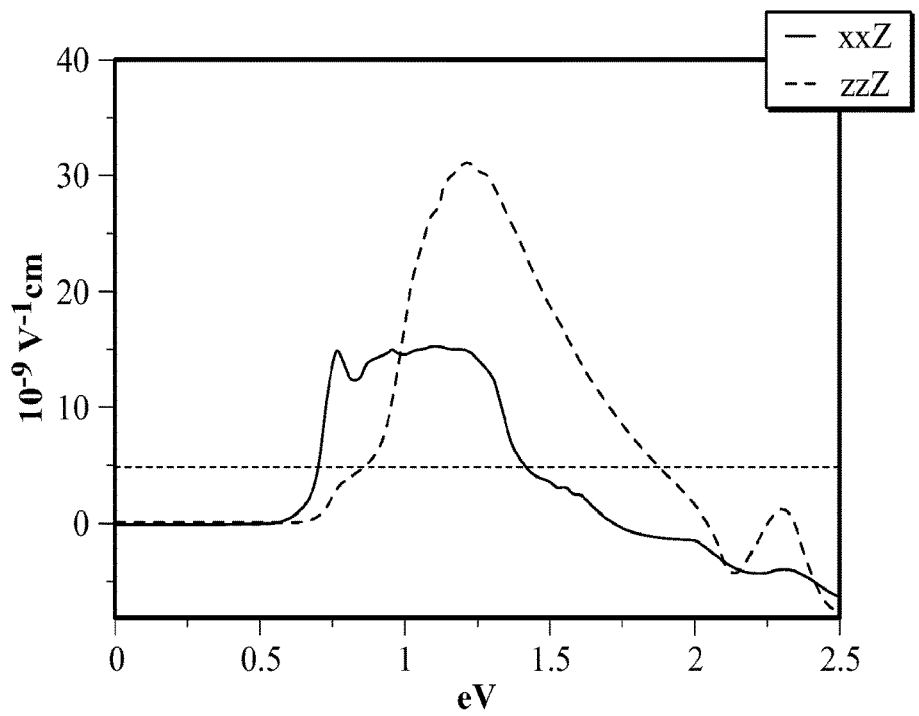

As shown in FIG. 6(a) and FIG. 6(b), the electronic structure of $LiBiO_3$ is very similar to the previous two materials. As with Pb-containing compounds, the low-lying hybridized Bi s states form the lowest unfilled bands, though the Bi s proportion is lower than that of Pb s in the aforementioned materials. Possibly as a consequence, the dispersion of the conduction band is reduced compared to $PbNiO_3$ and $Mg_{1/2}Zn_{1/2}PbO_3$ (FIG. 3), and the BPVE response is somewhat different: while the Glass coefficient is not as large as for the two lead-containing materials, the photocurrent density is higher, indicating increased absorption. Additionally, the band gap is larger, with HSE predicting 1.7-1.8 eV, positioned almost perfectly with respect to the visible spectrum. The density of states for $LiBiO_3$, shown in FIGS. 6 (a) and (b), is dominated by bismuth and oxygen. The band gap is set by transitions from O 2p to hybridized Bi 6s states. The band gap is modest (1.7 eV in HSE). The current density response, shown in (c) is quite high ($\approx$8×benchmark), with a large (d) Glass coefficient ($\approx$7×benchmark), indicating strong absorption in addition to long shift vectors.

When ranges are used herein for physical properties, such as molecular weight, or chemical properties, such as chemical formulae, all combinations, and subcombinations of ranges for specific embodiments therein are intended to be included.

The disclosures of each patent, patent application, and publication cited or described in this document are hereby incorporated herein by reference, in its entirety.

Those skilled in the art will appreciate that numerous changes and modifications can be made to the preferred embodiments of the invention and that such changes and modifications can be made without departing from the spirit of the invention. It is, therefore, intended that the appended claims cover all such equivalent variations as fall within the true spirit and scope of the invention.

What is claimed:
1. A composition, comprising: a polar oxide characterized as having a $LiNbO_3$ structure with a band gap of less than about 2.0 eV wherein (a) the polar oxide comprises one or more $d^{10}s^0$ cations and/or (b) the band gap is in the range of from about 1.7 eV to about 1.8 eV.

2. The composition of claim 1, wherein the band gap is less than about 1.8 eV.

3. The composition of claim 1, wherein the band gap is in the range of from about 1.2 eV to about 1.8 eV.

4. The composition of claim 1, wherein the band gap is in the range of from about 1.7 eV to about 1.8 eV.

5. The composition of claim 1, wherein the polar oxide comprises one or more $d^{10}s^0$ cations.

6. The composition of claim 5, wherein the one or more $d^{10}s^0$ cations are electronegative metals.

7. The composition of claim 5, wherein the one or more $d^{10}s^0$ cations comprises one or more of the following: $Pb^{4+}$, $Bi^{5+}$, $Tl^{3+}$, $Hg^{2+}$, $Au^{1+}$, $Pt^0$, $Sb^{5+}$, $Sn^{4+}$, $In^{3+}$, $Cd^{2+}$, $Ag^{1+}$, $Pd^0$, $As^{5+}$, $Ge^{4+}$, $Ga^{3+}$, $Zn^{2+}$, $Cu^{1+}$, $Ni^0$.

8. The composition of claim 6, wherein the polar oxide comprises $Mg_{1-x}Zn_xPbO_3$, wherein x is in the range of from about 0.01 to about 0.99.

9. The composition of claim 7, wherein the polar oxide comprises $Mg_{1/2}Zn_{1/2}PbO_3$.

10. The composition of claim 7, wherein the polar oxide comprises $PbNiO_3$.

11. The composition of claim 5, wherein the one or more $d^{10}s^0$ cations comprises $Bi^{5+}$.

12. The composition of claim 7, wherein the polar oxide comprises $LiBiO_3$.

13. The composition of claim 5, wherein the composition is characterized as having a polarization of at least about 50 µC/cm².

14. The composition of claim 5, wherein the composition is characterized as having a polarization of the range of from about 75 µC/cm² to about 100 µC/cm².

15. The composition of claim 5, wherein the composition is characterized as having a Glass coefficient of greater than about $30 \times 10^{-9}$ cm/V.

16. The composition of claim 5, wherein the composition is characterized as having a Glass coefficient of greater than about $80 \times 10^{-9}$ cm/V.

17. The composition of claim 5, wherein the composition is characterized as having a Glass coefficient of greater than about $115 \times 10^{-9}$ cm/V.

18. The composition of claim 5, wherein the composition is characterized as having a current density response of greater than about $13 \times 10^{-4}$ (A/m²)/(W/m²).

19. The composition of claim 5, wherein the composition is characterized as having a current density response of greater than about $20 \times 10^{-4}$ (A/m²)/(W/m²).

20. The composition of claim 5, wherein the composition is characterized as having a current density response of greater than about $45 \times 10^{-4}$ (A/m²)/(W/m²).

21. A photovoltaic device comprising one or more composition of claim 1.

22. A photovoltaic device comprising one or more composition of claim 5.

23. A photovoltaic device comprising one or more composition of claim 7.

24. A photovoltaic device comprising one or more composition of claim 9.

25. A photovoltaic device comprising one or more composition of claim 10.

26. A photovoltaic device comprising one or more composition of claim 12.

27. A sensor comprising one or more composition of claim 1.

28. A sensor comprising one or more composition of claim 5.

29. A sensor comprising one or more composition of claim 7.

30. A sensor comprising one or more composition of claim 9.

31. A sensor comprising one or more composition of claim 10.

32. A sensor comprising one or more composition of claim 12.

* * * * *